United States Patent [19]
Korsunsky et al.

[11] Patent Number: 5,462,444
[45] Date of Patent: Oct. 31, 1995

[54] ELECTRICAL CONNECTOR HAVING BUS BARS PROVIDING CIRCUIT BOARD RETENTION

[75] Inventors: Iosif Korsunsky, Harrisburg; Tod M. Harlan, Mechanicsburg; Joanne E. Shipe, Harrisburg, all of Pa.

[73] Assignee: The Whitaker Corporation, Wilmington, Del.

[21] Appl. No.: 382,545

[22] Filed: Feb. 2, 1995

Related U.S. Application Data

[62] Division of Ser. No. 145,018, Oct. 29, 1993, Pat. No. 5,411,404.

[51] Int. Cl.⁶ .......................... H01R 13/652; H01R 13/73
[52] U.S. Cl. .......................................... 439/108; 439/567
[58] Field of Search .......................... 439/82, 101, 108, 439/567, 571, 751

[56] References Cited

U.S. PATENT DOCUMENTS

| | | | |
|---|---|---|---|
| 2,754,486 | 7/1956 | Hathorn | 439/55 |
| 2,958,063 | 10/1960 | Stanwyck | 439/82 |
| 3,056,939 | 10/1962 | Rayburn | 439/55 |
| 3,162,721 | 12/1964 | Rayburn | 174/68.5 |
| 3,239,720 | 3/1966 | Rayburn | 439/83 |
| 3,524,108 | 8/1970 | English | 439/82 |
| 3,545,080 | 12/1970 | Evans | 29/629 |
| 3,747,045 | 7/1973 | Stross | 439/55 |
| 4,057,879 | 11/1977 | Eigenbrode | 439/358 |
| 4,460,230 | 7/1984 | McKee et al. | |
| 4,553,801 | 11/1985 | Zajeski | 439/595 |

(List continued on next page.)

FOREIGN PATENT DOCUMENTS

| | | | |
|---|---|---|---|
| 2221829 | 10/1974 | France | 439/751 |
| 1816073 | 2/1970 | Germany. | |
| 1916410 | 10/1970 | Germany | 439/751 |
| 2742716 | 5/1979 | Germany. | |
| 56-114078 | of 1981 | Japan. | |
| 56-72485 | 6/1981 | Japan. | |
| 57-80087 | 5/1982 | Japan. | |
| 57-82076 | 5/1982 | Japan. | |
| 59-25168 | of 1984 | Japan. | |
| 60-164342 | 12/1985 | Japan. | |

OTHER PUBLICATIONS

*Electronic Design*, vol. 33, No. 6, Mar. 1985, pp. 142–150, Hasbrouck Heights, N.J.; J. Shereff, "Special Edition Report—Printed Circuit Connectors".

AMP Catalog 85–773, "AMPMODU MTE Interconnection System", Nov. 1985; pp. 2, 17–25; AMP Incorporated, Harrisburg, Pa.

AMP Special Industries Standard Products Catalog, third Edition, Issued Aug. 1983, pp. 693–697; AMP Incorporated, Harrisburg, Pa.

AMP Engineering and Purchasing Guide, Fifth Edition, 1984, pp. I–3 to I–14; AMP Incorporated, Harrisburg, Pa.

AMP Standard Products Catalog, Fourth Edition, Mar. 1985, pp. 74614 753; AMP Incorporated, Harrisburg, Pa.

Kirayoglu, E. M., "Design/Performance Workshop: Retentive Solder Tails: A Design for 0.025 Square Posts", *Connection Technology*, Sep. 1986; vol. 2, No. 9, pp. 19–21.

*Primary Examiner*—Gary F. Paumen
*Attorney, Agent, or Firm*—Anton P. Ness

[57] ABSTRACT

An electrical connector (10) of the type having an array of signal contacts (22) surface mountable to pads of a circuit board (20), with at least one ground bus (40) having a plurality of post sections (44,50,52) insertable into through holes (34) of the circuit board. At least two of the post sections (50,52) include protuberances (54,56) proximate free ends thereof adapted to bear against side walls of the respective through holes upon insertion thereinto, for deflection of the shanks (62,64) of the post sections in the opposite direction. The protuberance of each of the at least two post sections extends in opposed directions along the row of posts, thus cooperating to act as a clamp of modest force to retain the connector to the board prior to contact soldering. The deflectable shank (62,64) preferably has a reduced cross-sectional area at root (66,68) facilitating deflection in the plastic region.

2 Claims, 5 Drawing Sheets

U.S. PATENT DOCUMENTS

| | | | |
|---|---|---|---|
| 4,735,587 | 4/1988 | Kirayoglu | 439/82 |
| 4,847,588 | 7/1989 | Doutrich | 439/751 |
| 4,900,276 | 2/1990 | Doutrich | 439/751 |
| 5,102,356 | 4/1992 | Adams et al. | 439/751 |
| 5,120,232 | 6/1992 | Korsunsky | 439/108 |
| 5,183,405 | 2/1993 | Elicker et al. | 439/108 |
| 5,199,885 | 4/1993 | Korsunsky et al. | 439/79 |
| 5,257,947 | 11/1993 | Scheer et al. | 439/567 |
| 5,257,948 | 11/1993 | Peterson | 439/571 |

ELECTRICAL CONNECTOR HAVING BUS BARS PROVIDING CIRCUIT BOARD RETENTION

This application is a Divisional of application Ser. No. 08/145,018 filed Oct. 29, 1993 now U.S. Pat. No. 5,411,404.

FIELD OF THE INVENTION

The invention is directed to an electrical connector which is mounted on a printed circuit board, and more particularly to one which has a grounding bus which allows for close centerline spacing of the terminals.

BACKGROUND OF THE INVENTION

There are currently numerous electrical connectors commercially available which are mounted to a printed circuit board. As the size of the machines in which the printed circuit boards are installed decreases, the density of the connectors positioned on the board must increase. Also, as the machines become more sophisticated, the complexity of the printed circuit boards and the connectors must increase. Consequently, the configuration of the machines requires that electrical connectors with numerous terminals extending therefrom be mounted on a printed circuit board in such a manner so as to occupy a minimal area of board real estate.

In order for the connectors to occupy a minimal amount of board real estate, it has become extremely desirable for connectors to have closely spaced terminals. To accomplish the required spacing, all dimensions of the connector must be minimized. However, the performance of the connector cannot be compromised due to the close centerline spacing of the terminals. It is therefore essential that the electrical characteristics of the connector not diminish as the size of the connector is reduced.

Consequently, in order to reduce the size of the connector while maintaining the electrical performance thereof, the present invention is directed to an enhanced ground bus. The ground bus requires minimal space, but provides the electrical characteristics to properly shield the closely spaced terminals of the connector. Such an enhanced ground bus is disclosed in U.S. Pat. No. 5,120,232, wherein matable ground bus bars are disposed in respective ones of matable plug and receptacle connectors. The matable section of a first one of the bus bars comprises staggered first and second mating portions along the connector length, with the first and second mating portions offset transversely, all in serpentine fashion; the matable section of the second bus bar comprises spaced first and second portions which are an array of spaced arms offset transversely which are deflected by the corresponding offset portions of the first bus bar and remain spring biased thereagainst after mating for an assured electrical connection therewith, in an interwoven arrangement. Additional mating arms of the first bus bar cooperate with the walls of the bus bar receiving recess of the connector housing to properly position bus bar for mating with the second bus bar. Each bus bar further includes an array of posts which extend from the respective connector housing to engage with ground circuits of the printed circuit board to which the connector is mounted.

Such connectors include signal contacts which are to be electrically interconnected to circuits of the printed circuit board by surface mounting, wherein the end or tail of the signal terminal is disposed atop a conductive pad of a respective board circuit along the adjacent major board surface, and preferably is soldered thereto. Since due to realities of manufacture and assembly of such connectors one or more of the contact tails is further from the respective pad than others, it is desired to apply force to urge or press the connector toward the board major surface during soldering to assure mechanical engagement between all contact tails and respective pads.

It is desired to provide the connector with integral means to generate mechanical securing of the connector prior to soldering, and requiring no additional hardware nor loose circuit board components to achieve presoldering holddown.

It is desired to provide a ground bus with posts which facilitate mechanical securing of the connector to the printed circuit board prior to soldering.

It is also desired to provide such enhanced mechanical securing while not substantially increasing the forces necessary to mount the connector onto the board.

SUMMARY OF THE INVENTION

The present invention provides a conductive member of a connector for mounting to a circuit board, where the conductive member includes a plurality of posts extending from the mounting face of the connector housing to be inserted into and soldered within plated through holes of the board. At least a pair of posts include protuberances near the free ends and extending from side edges the posts to engage a side wall of a through hole upon insertion, to be deflected toward the other side wall, with the protuberances extending in opposite directions and together generating a modest level of spring bias force against the side walls of the through holes, retaining the connector to the board until soldering. The conductive member can be a ground bus, or can be used as a power bus, or it can be a shield around the housing with a plurality of posts usable for grounding to ground circuitry of the board.

In another aspect of the present invention, a post of a contact in a board-mountable connector extends to a free end for through hole insertion and soldering and includes a protuberance to assure deflection upon engaging a side wall of the through hole. The beam section joins the body section at a root with a reduced cross-section which enables the deflection of the beam to occur in the plastic region rather than the elastic region of a force/deflection curve, thus enabling control over the amount of spring bias which results in a controlled retention force of the connector to the board.

In a specific embodiment, the present invention provides a ground bus bar with in-line ground posts which include post sections for insertion into respective through holes of a printed circuit board, wherein the post sections have been configured to generate a modest level of retention force for temporarily securing the connector to the board until soldering of the ground and signal contacts to respective through holes and pads of the board circuits. With the post sections being formed with the tips of their free ends generally spaced complementary with the through holes to facilitate initial entry, at least several of the post sections include protuberances each extending laterally for bearing against a side wall on one side of a respective through hole when the connector is fully mounted on the board, and deflecting the post sections generally toward the opposed side wall of the through hole, with at least one of the protuberances extending in a first direction along the row of posts and another thereof extending in the opposed second direction. In one embodiment, the protuberances are on adjacent post sections opposing each other as an associated pair. Further, those post sections having protuberances preferably include a reduced width section spaced from the protuberances and substantially adjacent the body section of the bus bar, facilitating deflection of the post section upon board mounting.

In another embodiment, where the bus bar post sections must not extend beyond the far surface of the circuit board upon full connector mounting, the protuberances are located proximate the mounting surface of the board as the tips of the free ends are proximate the opposed surface of the board and recessed slightly within the through hole. Straight ones of the foreshortened post sections alternate with those having a protuberance, and a post section having a protuberance in a first direction is thus isolated from a post section with its protuberance in the opposed second direction. Each post section having a protuberance is joined to the bus bar body inwardly of the connector mounting face so that the reduced dimension shank extends into the housing to maintain a sufficient length for the deflected post section upon mounting. The housing cavity provides clearance for deflection of the root of the post section within the housing.

The present invention is also inclusive of an additional embodiment to be used with a larger through hole of a circuit board. A contact member such as a ground or power contact, or even a board retention member, has a pair of coextending posts which are received into a common larger hole. The pair of posts include protuberances facing outwardly in opposite directions to engage opposed side walls of the through hole. Each post includes a root joining it to a body section which has a reduced cross-sectional area facilitating deflection, which enables deflection in the plastic region requiring less insertion force.

It is an objective of the present invention to provide a connector of the type mountable to a circuit board with at least certain contacts having post sections adapted to temporarily mechanically secure the connector to the circuit board until soldering of contacts to respective pads or plating material of the board.

It is also an objective to provide such a connector with at least several post sections which include protuberances which engage side walls of the respective through holes to provide such mechanical securement.

It is yet a further objective to provide such post sections with reduced dimension sections facilitating lateral deflection of said post sections upon engagement of said protuberances with said through hole side walls.

It is a further objective to provide at least several post sections of a ground bus of such a connector with such protuberances.

It is still further an objective to provide such ground bus with pairs of such post sections having opposing protuberances together generating opposing deflection forces for optimum mechanical securing.

DETAILED DESCRIPTION OF THE PREFERRED EMBODIMENT

Figure 1:
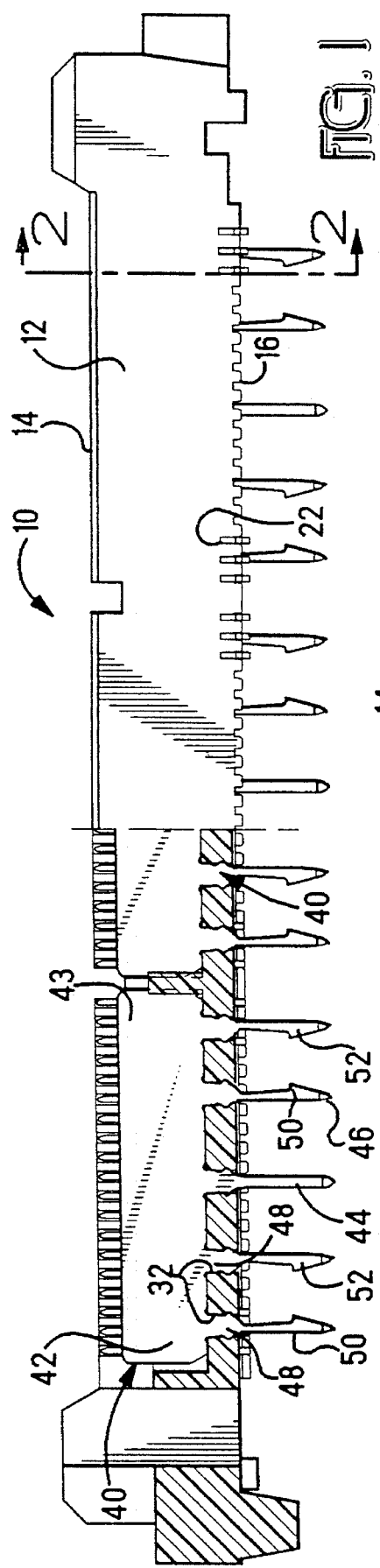
FIG. 1 is a part elevation, part section view of a connector of the type having a ground bus and including the present invention.
Figure 2:
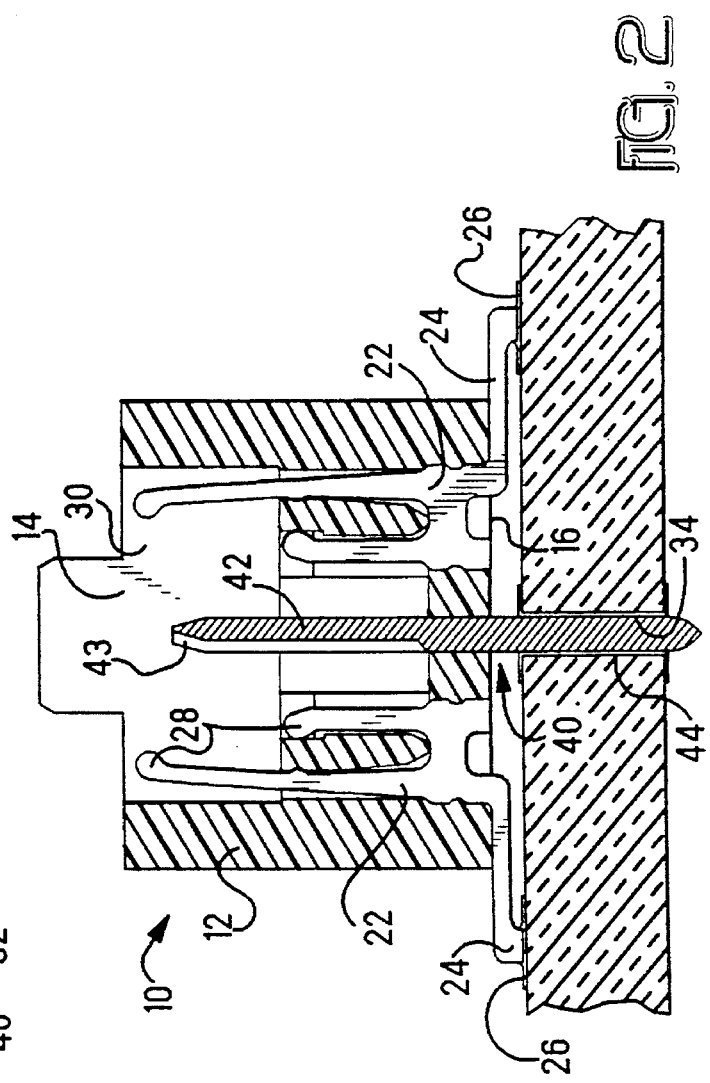
FIG. 2 is a cross-sectional view of the connector of FIG. 1 taken along lines 2—2 thereof illustrating the arrays of surface mountable signal contacts and the through hole mountable post sections of the ground bus.

Electrical connector 10 in FIGS. 1 and 2 includes a housing 12 having a mating face 14 adapted to mate with a complementary connector (not shown), and an opposed mounting face 16 for being mounted onto major surface 18 of a printed circuit board 20. Signal contact members 22 extend from first contact sections 24 depending from mounting face 16 of housing 12 for electrical connection with pads 26 of signal circuits on surface 18 by surface mounting preferably by soldering, to second contact sections 28 exposed within connector-receiving cavity 30 along mating face 14. Connector 10 is shown including several ground bus members 40 each having a body section 42 disposed within housing 12 with an upper portion 43 exposed along mating face 14 for electrically mating with a corresponding ground bus of the complementary connector. Each ground bus member 40 further includes a plurality of post sections 44,50,52 depending from body section 42 and extending through respective passageways 32 and outwardly from mounting face 16 to free ends 46 appropriately shaped to enter through holes 34 of printed circuit board 20, for post sections 44 to be received thereinto to define ground connections with ground circuitry thereof upon being soldered thereto. Each post section 44,50,52 preferably includes a widened base section 48 adjacent body section 42 for establishing an interference fit with the associated passageway 32 of housing 12 through which post section 44 extends and retaining ground bus member 40 within housing 12.

Figure 3:
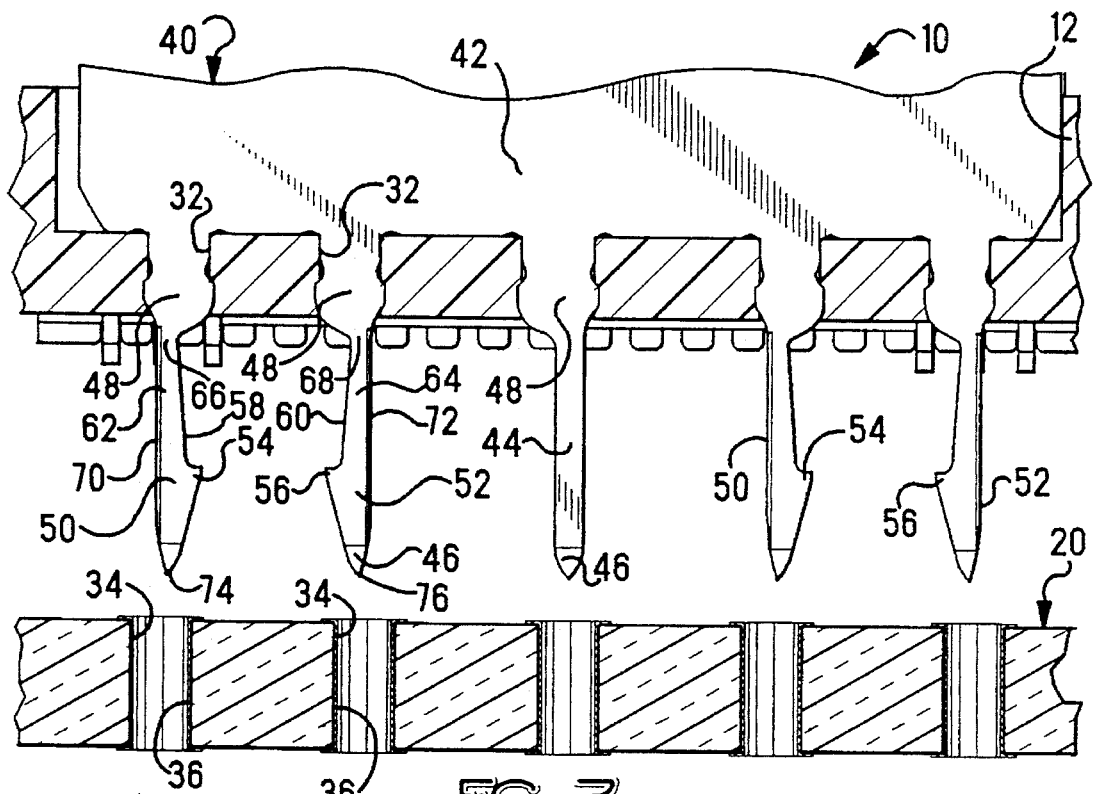
FIG. 3 is an elevation view of the ground bus of the connector spaced from a circuit board.

In the present invention, the post sections of each ground bus member 40 are formed by being stamped to provide a temporary mechanical fastening of connector 10 to printed circuit board 20 prior to soldering. As seen in FIG. 3 showing the ground bus 40 and the circuit board 20, housing passageways 32 are spaced to correspond with respective through holes 34, and the tips of free ends 46 of the posts are generally centered with respect to corresponding through holes 34 prior to insertion. Base sections 48 of the post sections are disposed in interference fit within respective ones of housing passageways 32. Post section 44 is rectilinear and therefore would be neutral in establishing connector retention force with a printed circuit board prior to soldering. Several of the post sections 50,52 are shaped to include a protuberance 54, 56 extending laterally from an edge 58,60 thereof near free ends 46 dimensioned large enough to assuredly bear against an adjacent portion of the side wall 36 of the respective through hole 34 and cause post section 50,52 to be deflected toward the side wall opposite the engaged wall.

Figure 4:
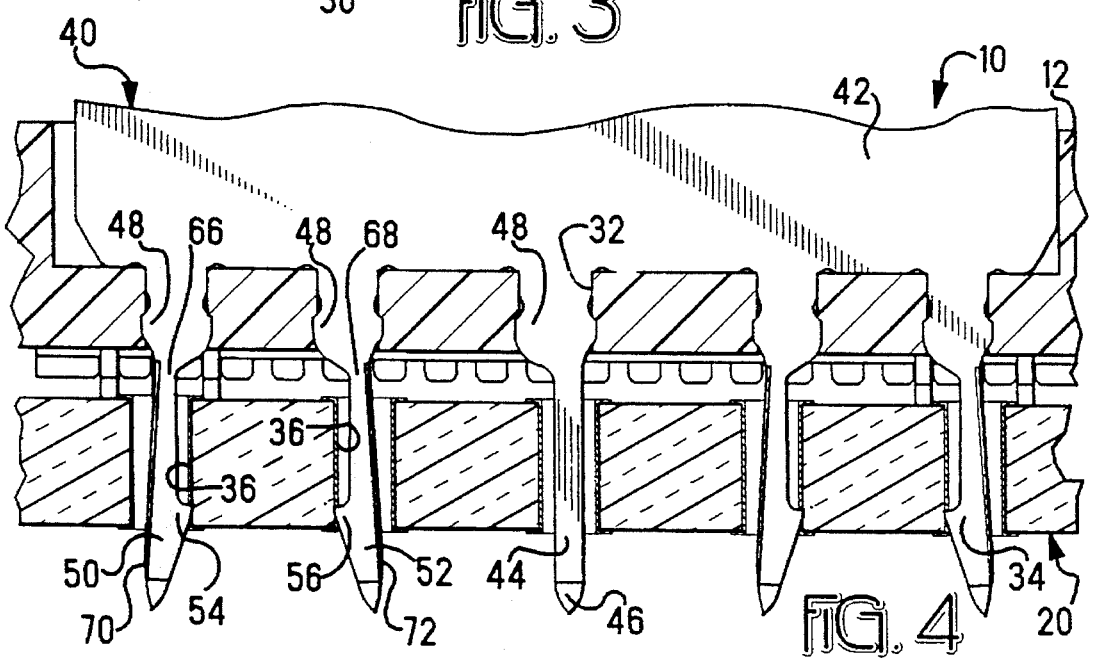
FIG. 4 is an enlarged section view of a portion of the connector of FIG. 1 after mounting illustrating deflection of several post sections of the bus bar of FIG. 3.
Figure 7:
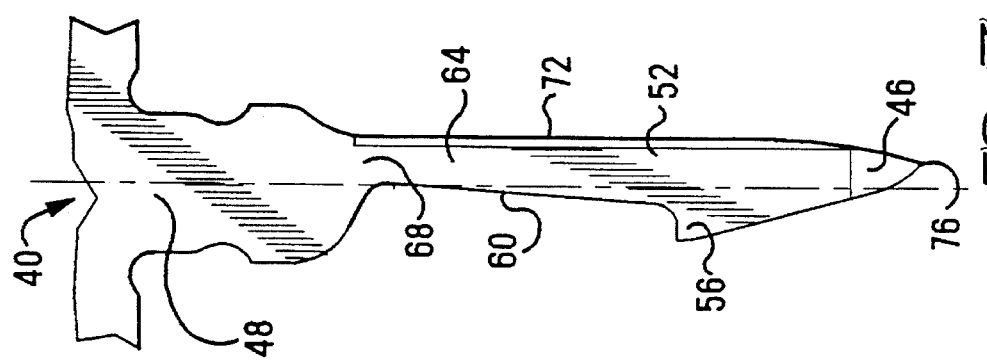
FIG. 7 is an enlarged view of a post section of the ground bus of FIGS. 1 to 3.

With reference to FIGS. 3, 4 and 7, preferably each post section 50,52 further includes a beam section 62, 64 tapered along side edge 58,60 extending to base section 48 from protuberance 54,56. Beam sections are thus reduced dimensionally extending to base sections 48 to a smallest width at roots 66,68, facilitating post section deflection to the opposite side edge 70,72 thereby reducing insertion forces during mounting of connector 10 onto printed circuit board 20, which is of significant value when such connectors are placed by robotic equipment in avoiding damage to the post sections by limiting forces applied by the equipment to overcome resistance to insertion.

Tips 74,76 preferably have a streamlined contour especially along opposite side edges 70,72 to more assuredly initially enter through holes of the printed circuit board upon mounting thus minimizing the potential for stubbing and post section damage. Such facilitated entry reduces initial insertion forces, especially considering slight variations in through hole location and dimensions even within strict manufacturing tolerances and also potential incremental misalignment of the post sections themselves.

Figures 5, 6:
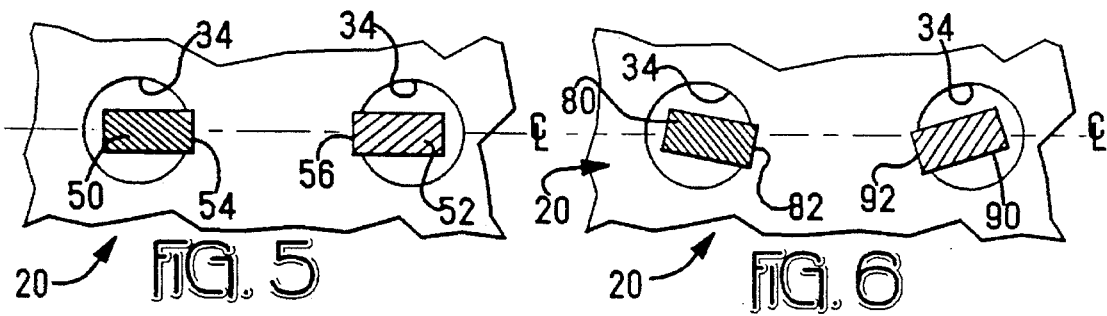
FIGS. 5 and 6 are representations of pairs of associated ground bus post sections prior to insertion into the through holes illustrating balanced force post deflection for mechanical securement of the connector to a circuit board, with the protuberances of the post sections in line with the row of post-receiving holes, and at an angle therewith, respectively.

It can be seen that providing post sections 50,52 in adjacent pairs balances the retention forces locally in opposing directions, with each such pair tending to act on the printed circuit board 20 as a modest clamp. Further, spacing the clamping pairs along the length of the connector, even among several ground bus members, assures that board retention is attained continuously along the length of the connector. FIG. 5 diagrammatically illustrates that a pair of associated post sections 50,52 "clamp" to the board when the protuberances 54,56 are in line with the centerline of the post-receiving holes 34. FIG. 6 similarly illustrates that the protuberances 82,92 of post sections 80,90 may be skewed slightly at an angle with respect to the centerline and still result in clamping; the post sections may be formed so that they extend from the body section of the ground bus member at a moderately skewed angle with respect to the plane thereof.

Figure 8:
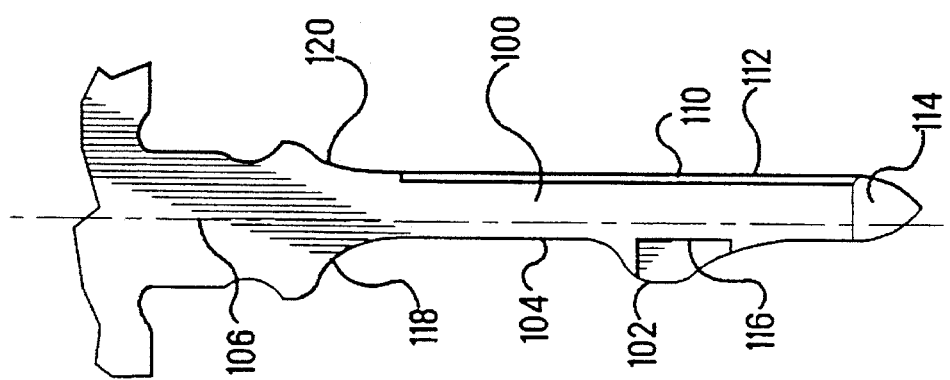

FIGS. 7 to 10 illustrate various embodiments of post sections of a ground bus. FIG. 7 is an enlarged view of a post section 52 of FIGS. 1 to 4. In FIG. 8, a post section 100 includes a protuberance 102 along side 104, with protuberance 102 being gently rounded. Post section 100 is shown offset to one side from the centerline bisecting base section 106 so that the tip of protuberance 102 is closer to the centerline than it otherwise would be if post section 100 were not offset. It is also preferred that post sections for ground bus members stamped from metal stock have the corners machined or coined as at 110 along opposite side 112 to define a chamfer or at least remove burrs along the portion of the post section which would otherwise bear against the through hole side wall during mounting thus possibly binding or limiting deflection or otherwise hindering insertion. Further it is preferred that protuberance 102 also be machined or coined at least proximate the tip 114, as shown at 116, to minimize snagging or biting into the material of the through hole side wall or the tendency to damage the post section, and thereby to result in appropriate automated mounting of the connector to the printed circuit board and to reduce the requisite insertion force and facilitate the controlled post section deflection desired in the present invention to attain mechanical securing to the board prior to soldering.

In FIG. 8, post section 100 is joined to base section 106 with generously radiused corners 118,120 at the transition between the wider base section 106 and the smaller dimensioned post section 100, which increases the metal cross-sectional area at the joint of post section 100 and base section 106 and serves to provide resistance to deflection of post section 100 during through hole insertion and contributes to insertion forces of the connector during mounting.

Figure 9:
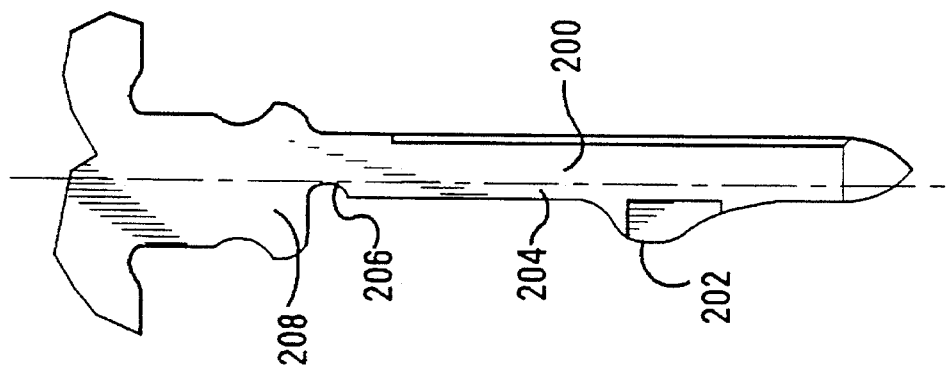

In FIG. 9, post section 200 is similar to post section 100 of FIG. 8, being offset from the centerline and including a rounded protuberance 202 along side 204. However, post section 200 further includes a notch 206 of small radius adjacent base section 208, which reduces the cross-sectional area at the joint with base section 208 and provides less resistance to deflection, thereby lowering the insertion forces during mounting of the connector to the printed circuit board.

Figure 10:
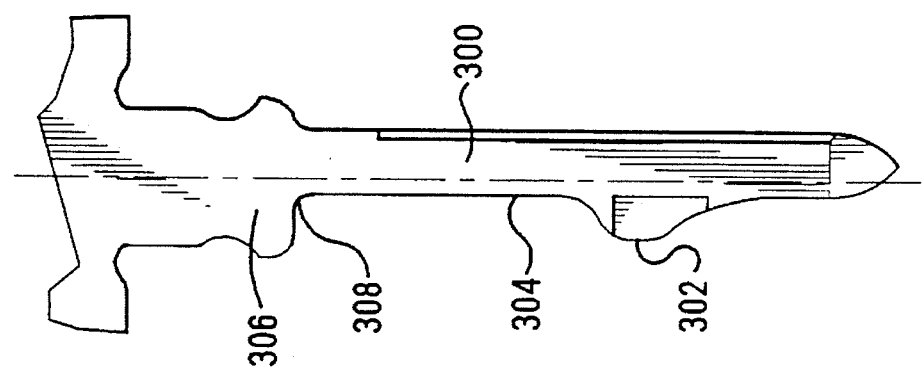
FIGS. 8 to 10 illustrate additional embodiments of post sections containing the invention.

Post section 300 of FIG. 10 includes protuberance 302 along side 304 and which is gently rounded. Post section 300 is shown offset (as in FIGS. 8 and 9) to one side from the centerline extending through base section 306 so that the tip of protuberance 302 is closer to the centerline. Post section 300 is shown to join wider dimensioned base section 306 at a joint 308 sharply defined along side 304 which functions similarly to notch 206 of post section 200 of FIG. 9 in facilitating deflection of the post section.

Figure 11:
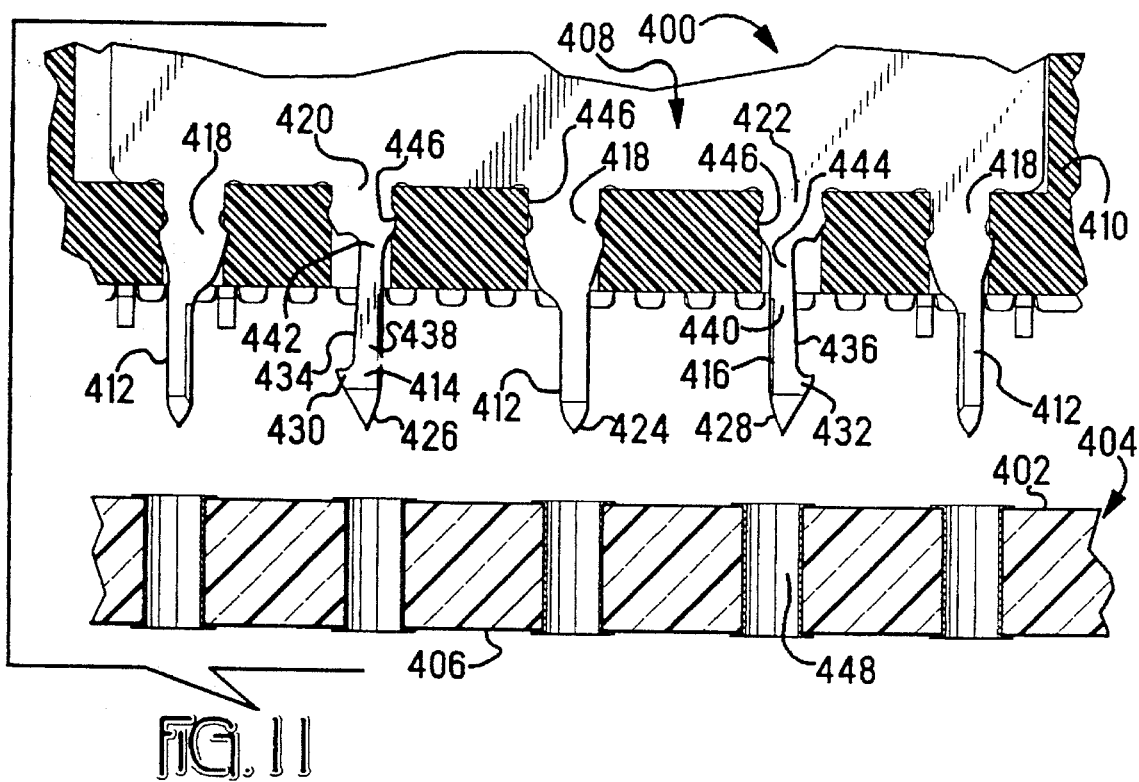
FIGS. 11 and 12 illustrate an alternate embodiment of connector with bus bar having retention features on short post sections, prior to and after board mounting respectively.
Figure 12:
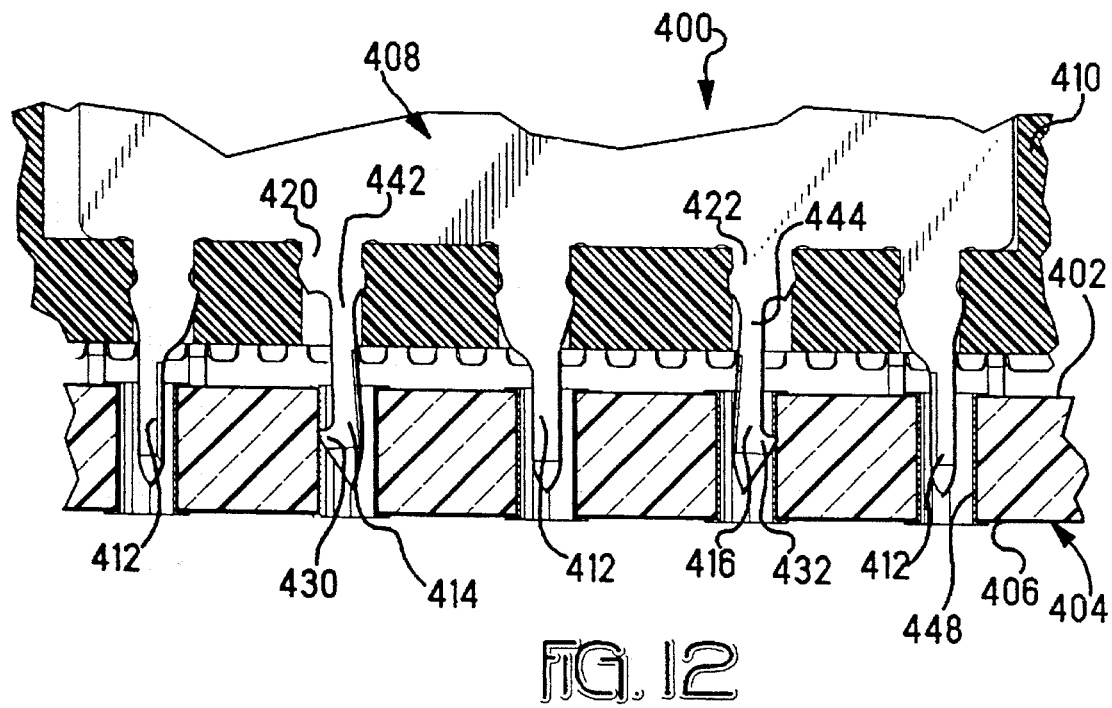

Another embodiment of the present invention is illustrated in FIGS. 11 and 12 of a connector 400 which is adapted to be mounted to mounting surface 402 of a circuit board 404 with no portions of ground posts protruding beyond the connector-remote surface 406. Tips of the free ends are seen recessed within the through holes. Ground bus 408 is secured in housing 410, with post sections 412,414, 416 extending from base sections 418,420,422 to free ends 424,426,428. Post sections 412 are rectilinear and are neutral in connector self-retention to board 404, while an inherent level of self-retention of connector 400 to board 404 is provided by post sections 414,416 which are alternated with post sections 412 for reasons which will be discussed.

Post sections 414,416 include protuberances 430,432 located proximate the mounting surface of the board and are defined on side edges 434,436 which extend toward base sections 420,422 along tapering shank sections 438,440 to roots 442,444. It can be seen that roots 442,444 are located well within housing passageways 446 thus lengthening the beam available for deflection upon insertion of the respective post section into the respective through hole 448. Base sections 420,422 thus must have a shorter axial length within respective passageways 446 than base sections 418 of post sections 412, which reduces the effective interference forces with passageways 446 able to be generated. Providing for increased density of rectilinear post sections 412 per unit length of bus bar establishes sufficient bus bar retention within housing 410. Sufficient retention to board 404 is generated by one post section deflected in each of the two opposed directions, per unit length of bus bar, which can be controlled by the amount of reduced width of the shank sections 438,440 of posts 414,416 at roots 442,444, and the axial length of the shank sections.

Figure 13:
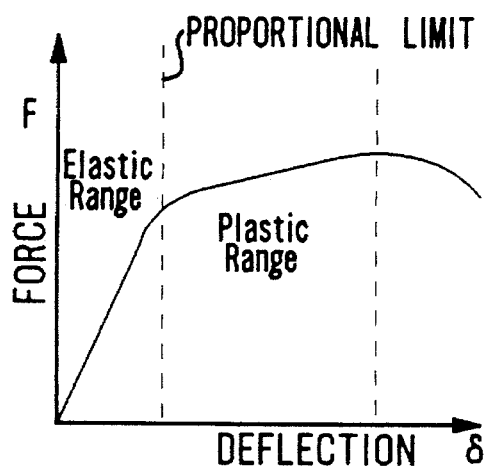
FIG. 13 is a graphic representation of typical stress/strain curve for a metal material.

The graph of FIG. 13 is generally representative of a typical force-deflection curve for metal material wherein Force F on the vertical axis is plotted against deflection $\delta$ on the horizontal axis, with a vertical line indicating the proportional limit or the threshold between elastic and plastic deformation. Deflection of a post section of the type like post section 100 of FIG. 8 operates predominately to the left of the proportional limit of the curve when inserted into a through hole of a printed circuit board during mounting, when a protuberance engages and bears against the through hole side wall, and where the post section has an unmodified joint with the base section adjacent the ground bus body section.

Figure 14:
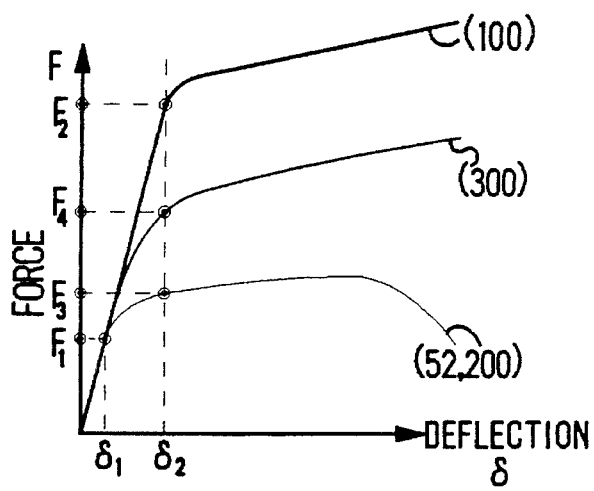
FIG. 14 is a force deflection response for post sections of the present invention of the embodiments shown in FIGS. 7 to 9.

The graph of FIG. 14 is generally representative of Force (F) versus Deflection ($\delta$) for deflection of a post section of the type like post sections 52,200 of FIGS. 7 and 9, post section 300 of FIG. 10 and post section 100 of FIG. 8, wherein the elastic range is set forth at the leftmost portion of the graph, and the plastic region is a much larger range rightward along the Deflection axis. It can be seen that post section 100 of FIG. 8 results in noticeably higher forces within the elastic range due to deflection, since no reduced beam cross-section is provided.

Curve 100 represents a general relationship between force and deflection. Given the tolerance conditions of printed circuit board holes and the connector assembly, post 100 in FIG. 8 would have a deflection range of $\delta_1$ to $\delta_2$ with resulting forces $F_1$ and $F_2$, with $\delta_1$ and $\delta_2$ being the lower and upper limits of acceptable manufacturing tolerances for both circuit board and connector fabrication. If all posts 100 were to be deflected at the upper force level $F_2$ due to accumulation of manufacturing tolerances, the total insertion forces seen by the connector would be excessive. By providing reduced cross-sectional areas along the beam sections of the posts, as in posts 52,200, plastic deformation of such posts begins far earlier along the force axis, at $\delta_1$ $F_1$ with the result that the upper limit of forces required to deflect the posts is substantially reduced, at $F_3$, when manufacturing tolerances are at the upper limit of the permissible range. For post 300 having a uniform cross-sectional area along the beam section, the plastic deformation of such post occurs later than that for posts 52,200 but earlier than that for post 100, with the upper limit of force $F_4$ thus yielding some benefit compared to upper limit $F_2$ for post 100. Such plastic deformation in the bus bar post sections is inconsequential during long-term in-service use, since the mechanical retention by bus bar posts is only used during connector mounting and thus is strictly temporary. Meanwhile, the advantages gained by the frictional forces of the deflected bus bar posts within the through holes provide a means to overcome the spring bias necessary to be generated between the signal contacts and the corresponding pads of the mounting surface of the circuit board as seen in FIG. 2 without any tooling or fastener accessories such as board locks, until soldering is performed to complete the necessary electrical connections and simultaneously provide sufficient connector-to-board mechanical retention during long-term in-service use.

Figure 15:
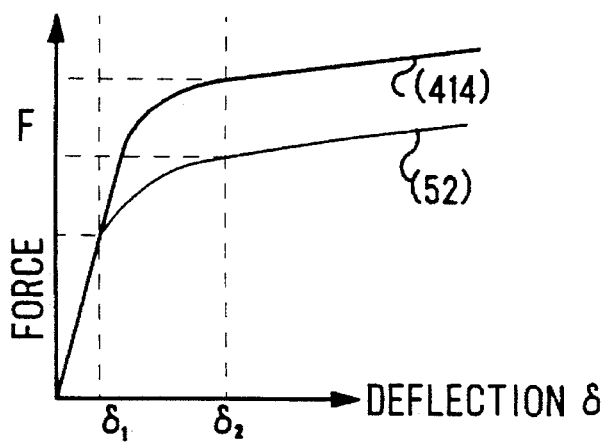
FIG. 15 is a force deflection response for the bus bars of the embodiments shown in FIGS. 4 and 12.

FIG. 15 is a graph which generally representative of Force (F) versus Deflection ($\delta$) for deflection of a post 414 of bus bar 408 such as is illustrated in FIGS. 11 and 12 each with two such deflectable beams per unit length where more retentive force is required per post, compared with a posts 52 of bus bar 40 of FIGS. 3 and 4 each having four deflected beams per unit length. Again the elastic range is set forth at the leftmost portion of the graph, and the plastic region is a much larger range rightward along the Deflection axis. It can be seen that higher forces are generated versus deflection for bus bars 408 with two deflected beams than for bus bars 40 with four deflected beams, since the root 442 of each post section 414 in FIG. 12 has a greater cross-sectional area than the root 68 of each post section 52 in FIG. 4.

Figure 16:
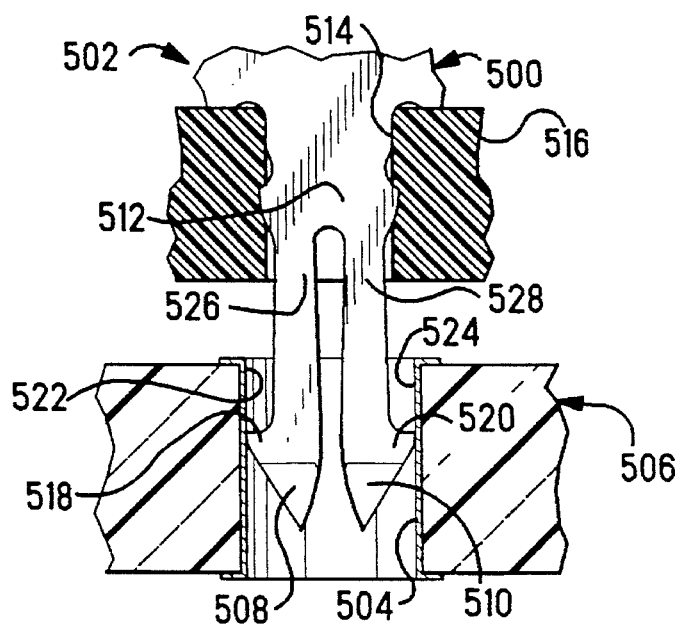
FIG. 16 is an additional embodiment wherein a retention member of a connector includes a pair of adjacent coextending posts insertable into a common through hole and including reduced dimension root sections facilitating deflection.

In yet another embodiment shown in FIG. 16, a member such as a board retention member or a power or ground contact 500 of a connector 502 is insertable into a through hole 504 of circuit board 506. A pair of posts 508,510 coextend from a base section 512 interferingly fitted in a passageway 514 of housing 516. Protuberances 518,520 face outwardly and will engage opposed side walls 522,524 of through hole 504, and posts 508,510 will be deflected toward each other. Roots 526,528 have a reduced cross-sectional area facilitating deflection of posts 508,510 as with post sections 50,52 of FIGS. 3, 4 and 7.

Variations and modifications may be made to the specific embodiments disclosed herein which are within the spirit of the invention and the scope of the claims.

We claim:

1. A board retention member for a connector of the type mountable to a circuit board, comprising:

a body section disposed and affixed within a dielectric housing and a pair of posts extending from the body section, respective beam sections extending beyond the mounting face of the housing to respective free ends adapted to be inserted into a respective through hole of a circuit board to be soldered therewithin, said posts each including a protuberance extending from a side edge of a respective said beam section proximate a respective said free end, with said protuberances extending outwardly in opposed directions away from each other, each said protuberance extending from an edge of a respective said beam section to engage an adjacent side wall of said respective through hole and deflect said beam section toward an opposing side wall of said through hole with the thus-deflected beam section bearing against the engaged side wall under spring bias sufficient to provide mechanical retention of the connector to the circuit board at least until soldering, and each said post includes a root joining said beam section to said body section having a cross-sectional area reduced from a general cross-sectional area of the remainder of said beam section between said root and said protuberance.

2. A board retention member as set forth in claim 1 wherein said reduced cross-section of said root is defined by said beam section being gradually tapered inwardly from said side edge from said protuberance to said root.

* * * * *